(12) United States Patent
Adams et al.

(10) Patent No.: US 7,506,282 B2
(45) Date of Patent: Mar. 17, 2009

(54) APPARATUS AND METHODS FOR PREDICTING AND/OR CALIBRATING MEMORY YIELDS

(75) Inventors: Chad A. Adams, Byron, MN (US); Anthony G. Aipperspach, Rochester, MN (US); George F. Paulik, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 11/207,068

(22) Filed: Aug. 18, 2005

(65) Prior Publication Data
US 2007/0044049 A1    Feb. 22, 2007

(51) Int. Cl.
*G06F 17/50* (2006.01)
(52) U.S. Cl. ............... 716/4; 716/5; 714/718; 702/127; 702/128; 324/210; 324/212; 324/765; 324/769
(58) Field of Classification Search ........... 716/4–5; 702/108, 116, 117, 127, 128; 438/14, 17, 438/18; 324/210–212, 765–769; 714/718
See application file for complete search history.

(56) References Cited

U.S. PATENT DOCUMENTS

| | | | | |
|---|---|---|---|---|
| 5,909,404 A | * | 6/1999 | Schwarz | 365/201 |
| 6,560,755 B1 | * | 5/2003 | Zhang et al. | 716/4 |
| 6,745,370 B1 | * | 6/2004 | Segal et al. | 716/2 |
| 7,194,336 B2 | * | 3/2007 | DiGianfilippo et al. | 700/265 |

* cited by examiner

*Primary Examiner*—Jack Chiang
*Assistant Examiner*—Nghia M Doan
(74) *Attorney, Agent, or Firm*—Dugan & Dugan (57) ABSTRACT

An apparatus and methods for predicting and/or for calibrating memory yields due to process defects and/or device variations, including determining a model of a memory cell, identifying a subset of parameters associated with the model, determining and executing a refined model using the parameters, determining a predicted probability the simulated memory cell will be operational based on the simulated operation of the refined model, determining yield prediction information from the predicted probability, and determining the minimum number of repair elements to include in a memory array design to insure a desired yield percentage based on the yield prediction information.

20 Claims, 4 Drawing Sheets

APPARATUS AND METHODS FOR PREDICTING AND/OR CALIBRATING MEMORY YIELDS

FIELD OF THE INVENTION

The present invention relates generally to methods and apparatus for designing and manufacturing memories, and more specifically to improving memory yields using redundancy.

BACKGROUND OF THE INVENTION

It would be beneficial to be able to accurately predict, at the beginning of memory design effort, the appropriate amount of redundancy needed to insure adequate yield in the manufacture of a memory. Too much redundancy unnecessarily increases memory size and decreases memory performance. Too little redundancy or the wrong kind of redundancy limits yield and profitability. Accordingly, techniques for determining the appropriate level of redundancy would be desirable.

SUMMARY OF THE INVENTION

In a first aspect, the present invention provides a method including the steps of determining a model of a memory cell, identifying a subset of parameters of the memory cell that influence the stability of the memory cell, determining a refined model of the memory cell based on the identified subset of parameters, simulating operation of variations of the refined model using different combinations of values of the parameters, determining a predicted probability that the simulated memory cell will operate correctly based on the simulated operation, calculating a predicted yield percentage of a memory array comprised of a plurality of the simulated memory cells based on the predicted probability the simulated memory cell will operate correctly, and determining a minimum number of repair elements that would change the predicted yield percentage of the memory array with redundancy to an acceptable level.

In a second aspect, the present invention provides an apparatus including a storage device and a processor coupled to the storage device, the processor adapted to determine a model of a memory cell, identify a subset of parameters of the memory cell that influence the stability of the memory cell, determine a refined model of the memory cell based on the identified subset of parameters, simulate operation of variations of the refined model using different combinations of values of the parameters, determine a predicted probability that the simulated memory cell will operate correctly based on the simulated operation, calculate a predicted yield percentage of a memory array comprised of a plurality of the simulated memory cells based on the predicted probability the simulated memory cell will operate correctly, and determine a minimum number of repair elements that would change the predicted yield percentage of the memory array with redundancy to an acceptable level.

Other features and aspects of the present invention will become more fully apparent from the following detailed description, the appended claims and the accompanying drawings.

DETAILED DESCRIPTION

The present invention provides apparatus and methods for predicting memory yields based upon estimations of anticipated failures due to both process defects and device variations. These predictions may be used to determine an appropriate amount of redundant memory cells (e.g., repair elements) to include in a given memory design to insure that a desired yield percentage may be achieved (e.g., using the repair elements if necessary) without having to include more redundant cells than necessary. The present invention also provides apparatus and methods for analyzing trade-offs between various redundancy implementations for a memory design that can achieve a desired yield.

Process defects include defects that result from such things as dust particles contaminating a device or the formation of an incorrect shape (e.g., a dimension that is outside of a predefined tolerance) of a device element that occurs during the manufacture of the device. In contrast, device variations may simply be the result of minor differences between devices that regularly occur because, at the atomic level, a process cannot be performed exactly the same each time. The inventors of the present invention have determined that failures that result from device variations, unlike those resulting from process defects, are typically voltage dependent. In other words, failures that result from device variations may be the result of interactions between different effects of variations in multiple different parameters that only become apparent at particular voltage levels. These failures typically result in stability failures and/or write failures. Stability failures include the inability of a memory cell to maintain a given state. Write failures include a condition where a memory cell's state cannot reliably be changed.

Until recently, failures due to device variations were largely ignored because of the difficulty of accurately predicting such failures and because these failures were not considered significant within the context of prior technologies. However, with highly integrated circuits such as those found in 90 nanometer circuit technologies, such failures are becoming a dominant factor. For example, the effects of threshold voltage variations in metal-oxide-semiconductor (MOS) devices may become a significant factor in Static Random Access Memory (SRAM) chip design. In other words, shifts in the threshold voltages of transistors due to device variations can cause an individual memory cell to favor a "0" or a "1" data state. In another example, a 90 nm SRAM device or "cell" may be disturbed when the device is merely accessed to ascertain its state. These problems are further exacerbated as devices are made smaller using new technologies. These problems cause cell instability to increase and product yields to decline. Thus, the problem is anticipated to get worse as the number of failures due to device variations have been determined to be proportional to the inverse of the square root of the area of the device. In other words, the more dense the technology, the more frequent the occurrence of failures due to device variations.

Embodiments of the present invention may include several steps. The devices (e.g., transistors) in a memory cell may each be characterized by (or modeled as) a number of device parameters that may each be represented as a distribution of possible values around a nominal value. Channel length and threshold voltage are examples of just two device parameters. Many others exist and may be considered. The invention may include first using a sensitivity analysis to identify a small subset of the device parameters that actually significantly impact the stability of a memory cell. This subset of device parameters may then be used to create numerous simulations of memory cells wherein all possible combinations of different values of these parameters are considered. The number of simulated memory cells to be created may depend on the number of parameters considered, the number of devices in the memory cell design, and the granularity of the device parameter values considered. The number of device parameters considered defines the number of dimensions of possible device parameter combinations.

Each simulated memory cell may be tested in the simulation to determine if the memory cell's particular combination of parameter values is expected to result in a stable memory cell. The results of simulating all of the possible memory cells based on the subset of identified parameters indicates the overall probability any given memory cell will fail due to device variations. This probability may then be used to calculate the percentage yield that may be expected from a SRAM comprised of a large array of memory cells.

In some embodiments, this calculation may be extended to consider the benefit of adding extra or redundant cells that may be used as "repair cells" in place of cells that may fail. Such repair cells may be included in an SRAM design in the form of array repair elements which may each include one or more extra columns (or rows) of memory cells. The calculation may be extended to determine whether, given the yield percentage determined above, a complete array of good memory cells can be assembled from the original array and the repair elements with an acceptably high probability, or whether additional repair elements are required to insure that, with an acceptably high probability, a complete array can be assembled.

Thus, using the above described simulation information, a memory may be designed with a desired yield percentage to within a certain degree of error. Even if the error is significant, being able to compare different designs relative to each other in terms of yield provides a memory designer a method of assessing the value of different kinds of redundancy. For example, a designer could use the above method to compare the relative benefits of adding two row repair elements to an array versus adding one column repair element to the same array.

Finally, once a memory design is actually manufactured, physical hardware tests may be performed to determine the actual yield. As mentioned above, failures due to device variations may be identified based on a given failure being voltage dependent. The remaining failures may be attributed to process defects. By using the actual failure rate due to device variations, the actual probability of a single cell experiencing a failure due to device variations may be calculated. This actual or observed probability may be compared against the simulated or predicted probability calculated above. Any differences may be used to improve the original model of the cell (e.g., the distributions used to characterize the cell) used in the simulation.

As with the failures due to device variations, failures attributed to process defects may be separately predicted but based on collected information about, for example, single cell fails, cell pair fails, wordline fails, bitline fails, etc. The predicted failures may be used to determine predicted probabilities that may be used to determine the relative benefits of different redundancy designs. Further, the predicted probability of a single cell experiencing a failure due to process defects may be compared to the observed actual failure rate attributed to process defects and any differences noted may be used to improve the original model of the cell.

In an exemplary embodiment, the apparatus of the present invention may be implemented with any suitable computer or computer system which can be a stand-alone computer, computer system, or computer network. The computer can include a central processing unit (CPU), an input device, such as a keyboard, a mouse, or other pointing device, a random access memory (RAM) device, a read-only memory (ROM) device, a display device such as a computer monitor, an output device such as a printer, a storage device for storing programs, data, and/or a database including any data, code, and/or information utilized in performing any and/or all of the methods of the present invention, a transmitter (e.g., a LAN adapter) for transmitting data and/or information to another computer or device in a network, and a receiver for receiving data and/or information from another computer or device in the network.

Figure 1:
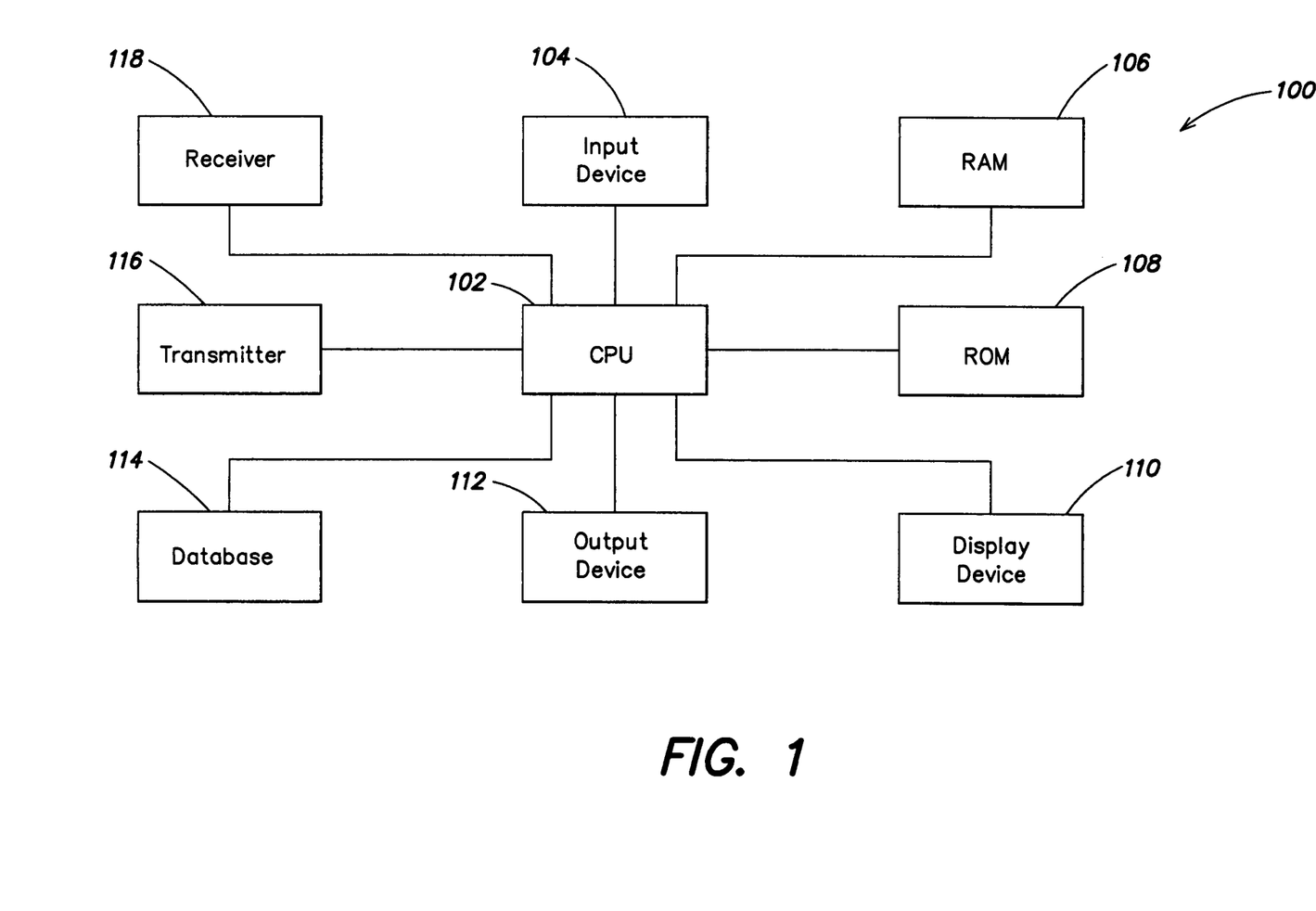
FIG. 1 depicts a block diagram of an exemplary embodiment of an apparatus according to the present invention.

Turning to FIG. 1, a block diagram depicting an example embodiment of apparatus of the present invention is designated generally by the reference numeral 100. With reference to FIG. 1, the apparatus 100, in an exemplary embodiment, may be any suitable computer, computer system, desktop computer, workstation computer system, micro-computer, minicomputer, mainframe computer, or any combination of same. The apparatus 100 may include a central processing unit (CPU) 102 which may include any number of microprocessors or other processing devices. The CPU 102 may provide control over the operation of the apparatus 100 and perform any necessary processing routines and/or computational routines described herein. Further, the CPU 102 may execute software to perform the methods of the present invention and/or process relevant data using any suitable software, such as, for example, HSPICE® circuit simulation software provided by Synopsys®, Inc. and/or POWERSPICE® software provided by International Business Machines® Corporation, both of which, including all related documentation, are incorporated herein by reference.

The apparatus 100 may also include an input device 104 which, in an exemplary embodiment, may include a keyboard, a mouse, or any other suitable user pointing device, for inputting data and/or information into the apparatus 100. The apparatus 100 may also include a random access memory (RAM) device 106 and a read-only memory (ROM) device 108.

With references once again to FIG. 1, the apparatus 100 may also include a display device 110 such as a computer monitor for providing or displaying information to a user, and an output device 112 such as a printer for providing a hard copy output of information provided by the apparatus 100. Both or either of the display device 110 and output device 112 may display the results of any of the calculations and/or simulations described below.

In at least one exemplary embodiment, the apparatus 100 may include one or more databases 114. The databases 114 may store any and/or all of the data and/or information described herein as being utilized by the apparatus 100 in performing any of the various processing routines and/or computational routines described herein in performing the methods of the present invention.

In an exemplary embodiment, the apparatus 100, which can be utilized in a network environment, can also include a transmitter 116 and a receiver 118, for transmitting and for receiving, respectively, data and/or information processed by and/or utilized by the apparatus 100 in performing any of the processing routines described herein.

Figure 2:
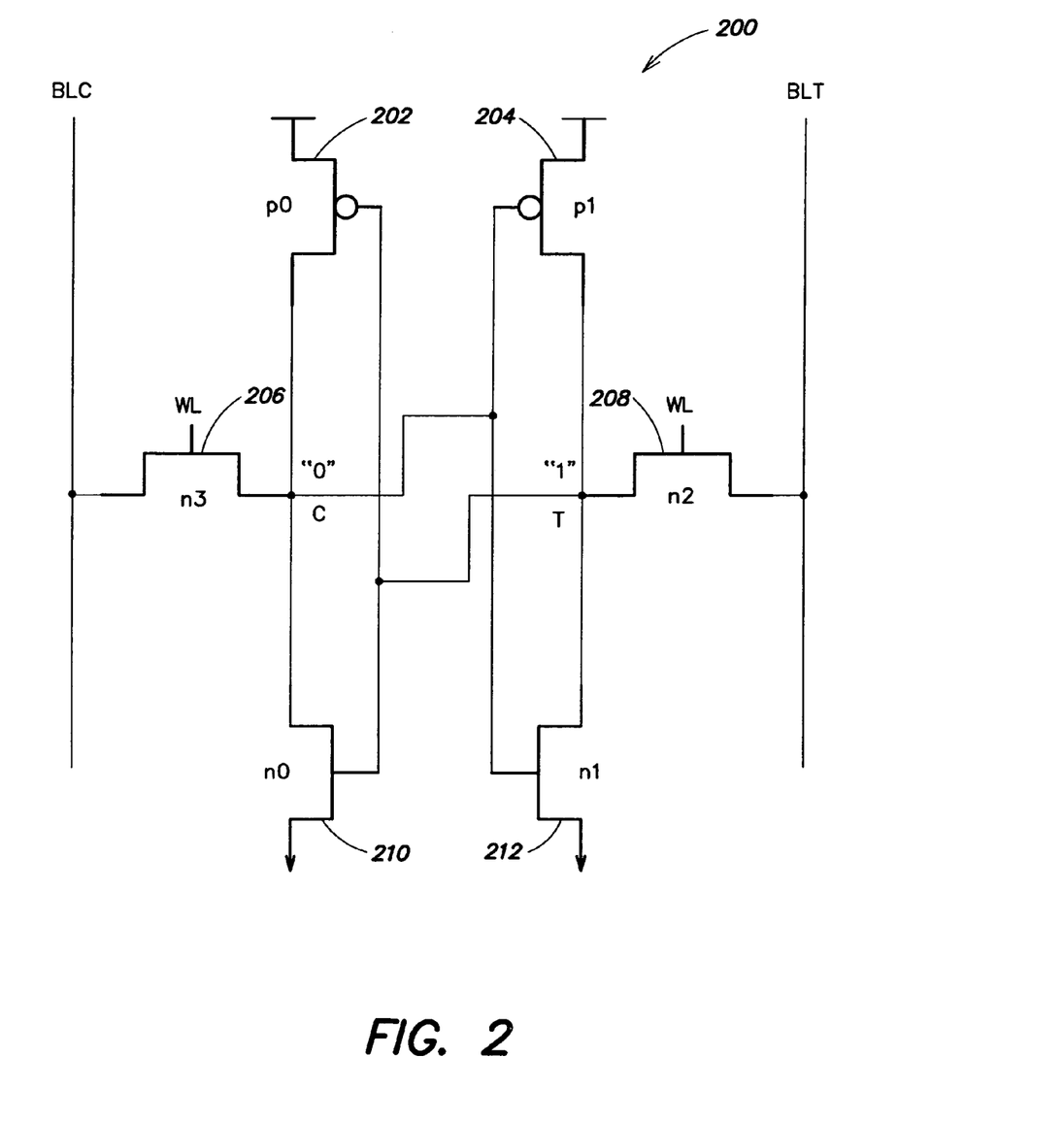
FIG. 2 depicts a schematic diagram of an example memory cell for which design the apparatus and methods of the present invention may be utilized in predicting stability characteristics and/or calibrating redundancy.

FIG. 2 is a schematic diagram of an example memory cell, e.g., an SRAM memory cell, for which design the apparatus 100 and methods of the present invention can be utilized to predict stability characteristics and help design redundancy so as to obtain optimum yield rates. In an exemplary embodiment, the memory cell may include six field effect transistors (FETs) or equivalent devices and can be symmetrical such that three FETs or devices on the left side of the cell are symmetrical with the three FETs or devices on the right side of the cell. If, theoretically speaking, each of the FETs or devices exactly matched its opposite device, then the SRAM memory cell would be optimized for a given design. In the real world, however, each individual device typically has a set of nominal design characteristics along with local device-to-device variations associated therewith. These device-to-device variations may, for example, include variations in length, width, threshold voltage, and/or parasitic resistance, among others.

With reference to FIG. 2, an exemplary embodiment of a memory cell is depicted therein and is designated by the reference numeral 200. The memory cell 200 includes six (6) FET devices 202, 204, 206, 208, 210, 212. With reference to FIG. 2, the example memory cell 200 includes two P-type FETs 202, 204 and four N-type FETs 206, 208, 210, 212. The memory cell 200 is symmetrical, having a P-type and two N-type FETs on each side of the memory cell 200. Each of the respective FETs are connected to and/or between the respective True Bit Line (BLT), Complement Bit Line (BLC), Word Line (WL), Complement Data Node (C), and True Data Node (T), as shown. The respective states "0" and "1" are shown as corresponding to the C and T nodes, respectively. Although the memory cell 200 of FIG. 2 is shown as containing six FETS, it is important to note that the apparatus 100 and methods of the present invention can be utilized with memory cells containing any number of FETS or other devices and can have any appropriate or practicable transistor types, size, shape, area, and/or form.

In an exemplary embodiment, the present invention provides apparatus and methods for predicting the stability characteristics of memory cells such as those of the type illustrated in FIG. 2 and/or for analyzing the trade-offs between various redundancy implementations for a design of an array of such memory cells so as to provide for a maximum, acceptable, and/or desired yield. The present invention is also applicable to other memory cell types.

In an exemplary embodiment, the apparatus 100 and methods of the present invention can also be utilized to correlate hardware results with statistical information and/or probabilistic predictions so as to facilitate the making of adjustments and/or iterative changes to fabrication models. In this manner, for example, results from a previous fabrication model or fabrication models can be utilized by the present invention in order to generate or formulate an improved or refined subsequent fabrication model or models which can provide for enhanced yields as compared to a previous fabrication model(s).

Figure 3:
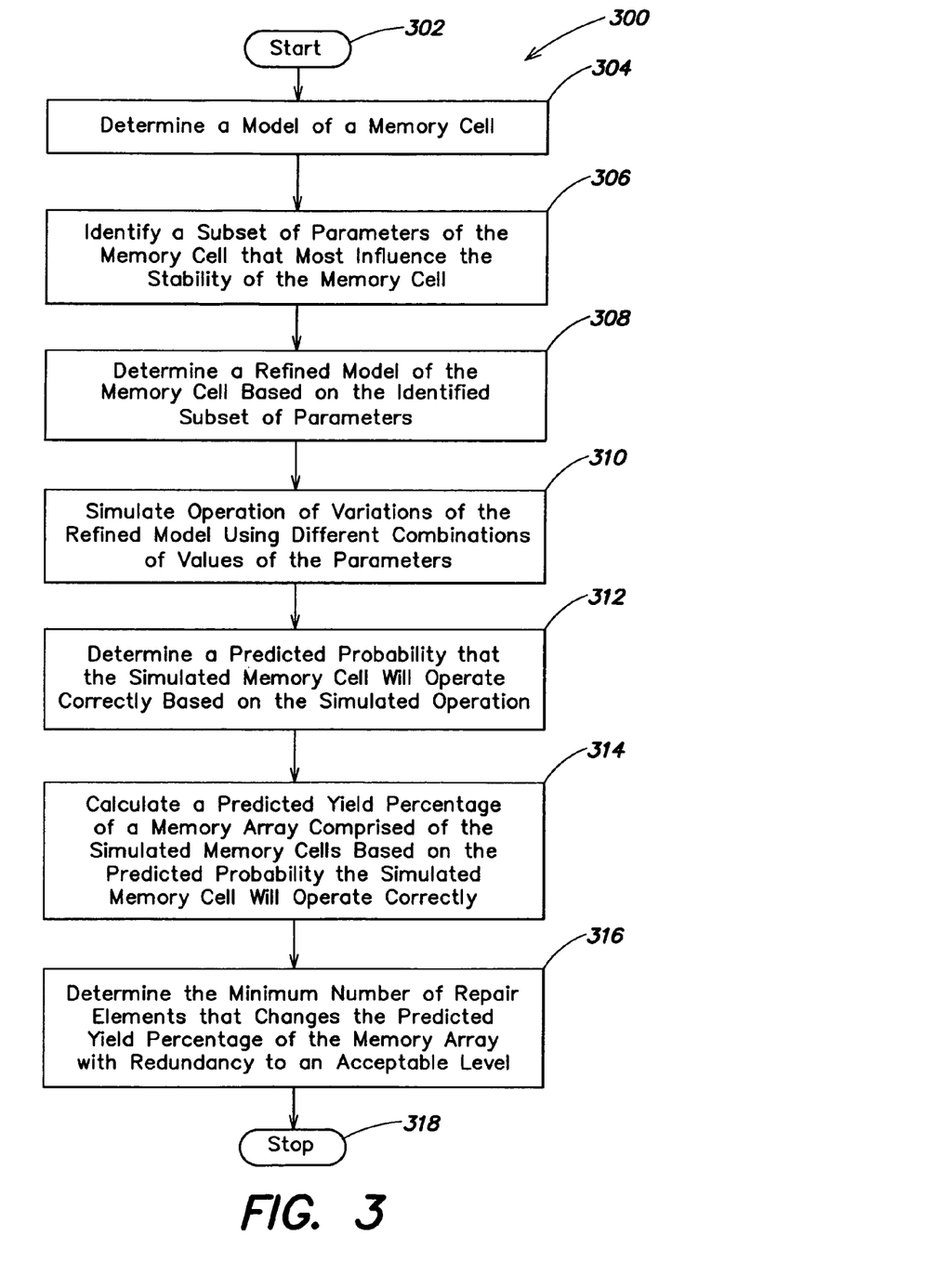
FIG. 3 depicts a flowchart of an exemplary embodiment of a method for performing a process according to the present invention.

FIG. 3 is a flowchart of an exemplary embodiment method 300 for utilizing the apparatus 100 and methods of the present invention in order to predict reduced memory yields due to failures from both device variations and/or process defects. In an exemplary embodiment, the methods of the present invention may include performing a number of processing and/or computing steps. The apparatus 100 of the present invention may be utilized to perform any one or more of the described processing and/or computing steps. In at least one exemplary embodiment, the apparatus 100 may be programmed to perform any number of and/or all of the herein-described processing and/or computing steps, associated with the methods of the present invention, automatically and without human intervention.

In another exemplary embodiment, a user or operator may interact with the apparatus 100 at any one or more of the steps, and/or at each step, of the methods of the present invention. In at least one exemplary embodiment, excluding any prior manual data entry, prior manual data storage, and/or any initial manual activation of the apparatus 100, each and every step of the process described in connection with the exemplary embodiment of FIG. 3 may be performed by the apparatus 100 automatically. In another exemplary embodiment, any data and/or information needed and/or utilized by the apparatus 100, to perform the methods of the present invention, may also be automatically obtained, received, and/or otherwise provided, to the apparatus 100.

With reference to FIG. 3, the operation of the apparatus 100 and methods of the present invention commences at step 302. At step 304, a model of a memory cell is determined or established. In some embodiments, an existing model of a memory cell may be retrieved from a database. Interaction of ideal circuit components and simulation (or modeling) of circuits constructed of such components is well known and is not described herein. Modeling of a memory circuit or cell 200 that is constructed of real word components may involve consideration of the interaction of the effects of all the possible variations that real world components may include. Thus, as indicated above, the devices (e.g., transistors) 202, 204, 206, 208, 210, 212 in a memory cell 200 may each be characterized by (or modeled as) a large number of device parameters. Each of the device parameters is a variable that represents a characteristic value of a device. These parameters can include any one or more of the length, width, and/or threshold voltage of each device, or any changes in any of these parameters (e.g. $\Delta L$ (change in length), $\Delta W$ (change in width), $\Delta V_T$ (change in threshold voltage), resistance, $T_{ox}$ (oxide thickness), etc.). These device parameters may also include a parasitic resistance and/or any measurable characteristics of materials utilized in fabricating the devices. These parameters can also include any other parameter or parameters which can or may be associated with the materials utilized in the fabrication process, in fabrication operations, and/or any other parameters which can or may be identified from time to time in memory design, development, and/or testing, processes. Many other parameters may be used.

Each of the device parameters may be represented as a distribution of possible values around a nominal value. In some embodiments, normal or Gaussian distributions may be used. In other embodiments, distributions that more accurately reflect the probabilities a parameter will have a value other than the nominal value may be used.

In Step 306, a subset of the parameters is identified. The inventors of the present invention have determined that even though the number of parameters that may be used to characterize a memory device 202, 204, 206, 208, 210, 212 is large, a much smaller subset of parameters may be employed to accurately predict yield if the more significant or influential parameters are selected. By reducing the number of parameters to be considered, the number of calculations is drastically reduced and a solution may be determined much more efficiently. Thus, a sensitivity analysis may be performed to identify a small subset of the device parameters that actually significantly impact the stability of a memory cell 200. In some embodiments, each parameter being analyzed may be repeatedly varied by increasing amounts out to, for example, three times a standard deviation (e.g., 3σ) from the nominal value of the parameter. While other parameters are held at their nominal values, operation of the memory cell may be simulated. Once the memory cell becomes unstable in the simulation due to varying the parameter under test, the parameter's influence may be ranked based on how far the parameter was varied from its nominal value before the memory cell became unstable. For example, parameters that cause instability with small variations (e.g., <2σ) may be considered more significant or influential then parameters that do not cause instability even with larger variations (e.g., >2σ). Based on the relative influence rankings of the parameters, a subset of parameters that individually most significantly affect memory cell stability is selected. Meanwhile, parameters that do not significantly individually influence stability may be removed from further analysis.

The number of parameters to be considered may be further reduced by considering the impact or sensitivity of each parameter on a per device basis. In other words, just because a parameter significantly impacts the stability of a cell when it is varied only slightly in one device of the cell, does not mean that varying the parameter in another device will necessarily have any impact on the cell's stability. Thus, by only considering parameters associated with a particular device (as opposed to all devices) which have a significant impact on cell stability, the number of simulations to consider is substantially reduced.

The selected subset of device parameters may be used to create numerous simulations of memory cells wherein all possible combinations of selected different values of these parameters are considered. The number of simulated memory cells to be created may depend on the number of parameters considered, the number of devices in the memory cell design, and the granularity of the device parameter values considered. As indicated above, the number of device parameters considered defines the number of dimensions of possible device parameter combinations. In Step 308, the memory cell 200 is modeled using only the subset of parameters that were identified in Step 306. This model may be thought of as a refined model in that with only a limited number of parameters, an accurate simulation of the operation of the memory cell 200 may be tested. For example, using only five parameters for each of the two P-type devices 202, 204 and three parameters for each of the four N-type devices 206, 208, 210, 212, a practicable computer simulation of the memory cell 200 may be executed that accurately reflects real world operation of the memory cell 200.

Figure 4:
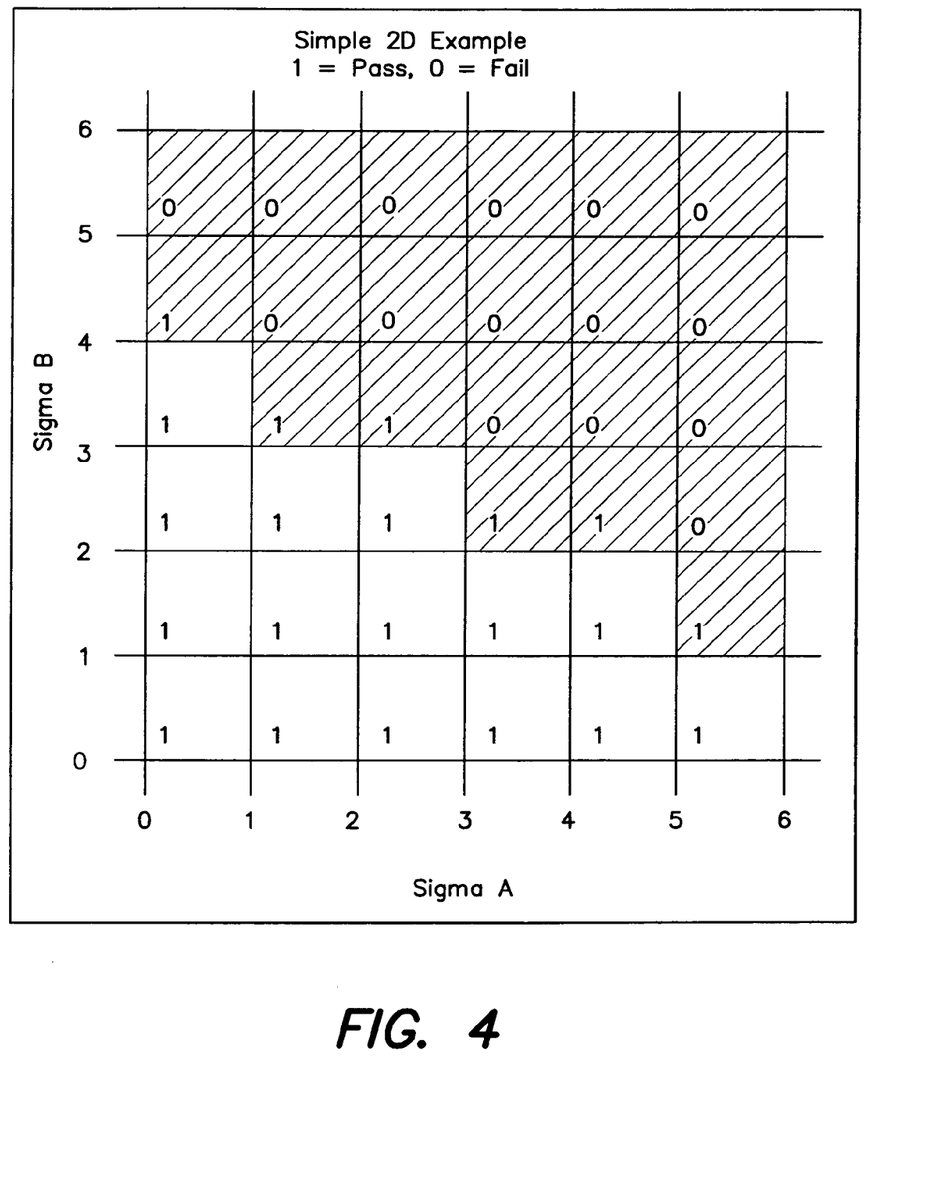
FIG. 4 depicts a simplified two-dimensional pass/fail matrix which may be used in performing the example method described in connection with FIG. 3.

In Step 310, the refined model determined in Step 308 is used to test each of the possible combinations of different parameter values within the identified subset of parameters. In some embodiments, only a representative number of values spanning a predefined range are selected for running the simulations. For example, the first five or six integer multiples of a standard deviation (σ) from the nominal value may be used. In other words, the values may range from the nominal value plus 0σ to the nominal value plus 6σ stepping by σ. Other values, granularities (steps), and ranges may be used. Therefore, for example, if a refined model uses only two parameters to characterize each of the six devices in the example memory cell 200 and values ranging from nominal plus 0σ to nominal plus 6σ in steps of σ, a total of 36 simulations would allow testing of all the possible combinations of selected values. The use of two parameters means that the six selected values can be combined in thirty-six ways. FIG. 4 represents this simple two dimensional example graphically but any number of dimensions could be used. For example, three parameter values with six selected values would result in 216 combinations to be simulated. More generally, the number of combinations to be simulated "S" may be determined based on the following equation:

$$S = M^N$$
$$= \left[\left[\frac{\sigma_{MAX} - \sigma_{MIN}}{G}\right] + 1\right]^N$$

where M represents the number of points per distribution to analyze, N represents the number of distributions (e.g., the sum of the selected distributions for each device), $\sigma_{MAX}$ represents the largest multiple of sigma to be considered, $\sigma_{MIN}$ represents the smallest multiple of sigma to be considered, and G represents the product of the number of steps of sigma for all the parameters.

In some embodiments, the number of simulations that are to be considered may be further reduced by applying knowledge of the physical principles that may be invoked by the variations being simulated, particularly once a failure is produced as the variations range further from the nominal value. In other words, for example, if at a 4σ variation, a stability failure occurs and consideration of the physics of the circuit with the 4σ variation reveals that the cell will act as an oscillator for all parameter values at 4σ and beyond, combinations involving parameter values beyond 4σ need not necessarily be executed.

FIG. 4 shows a simplified two-dimensional "pass/fail" matrix or graph which can be used to indicate the respective "pass/fail" simulation results for each of the parameter value combinations identified in the 6 by 6 (6 sigma accuracy) matrix. In other words, for example, if a particular combination of parameter A value 2σ and parameter B 5σ results in a memory cell model that fails to operate correctly in simulation, the intersection of the corresponding column and row may be tagged with a "0" to represent the failure. As explained above, in the case of the example shown on FIG. 4, where a six sigma (6σ) accuracy is used for each of the two parameters, the 6 by 6 matrix includes results for 36 simulations. A "1" signifies a "pass" condition and a "0" signifies a "fail" condition.

Thus, each of the 36 simulated memory cell variations may be tested in the simulation to determine if the memory cell's particular combination of parameter values is expected to result in a stable memory cell. The results of simulating all of the possible memory cell variations based on the subset of identified parameters may be used to predict the overall probability a given memory cell will either fail due to device variations, or operate correctly.

Turning back to FIG. 3, in Step 312, the overall probability a given memory cell will operate correctly (e.g., pass without regard to failures related to process defects (non-device variation related defects)) or fail due to device variations is predicted based on the results of the simulations. With reference to the example depicted in FIG. 4, once the results of each simulation of the different combinations of parameter values has been recorded, a "fail" region may be demarcated, as represented by the shaded area of the 6×6 matrix, and a "pass" region may be demarcated, as represented by the un-shaded area of the graph. It should be understood that for an N dimensional matrix (e.g., N number of device parameters)

pass or fail regions may still be demarcated even though it may become difficult to represent the regions graphically. Also note that in the simple example of FIG. 4, the area surrounded by four intersections is shaded if half or more of the surrounding intersections represent failures. In other words, as an approximation for the given example, each square of area on the graph is allocated to the pass region or the fail region based on the status of the four closest known simulated outcomes (e.g., the surrounding intersection points). That is, if a square has 2, 3, or 4 corners that failed, the entire square may be considered a fail. In some other embodiments, different, more accurate approximations or curve fitting methods may be used. For example, each square of area may by divided into four equal square sub-regions and each sub-region may be given the same status as the closest intersection point. In other words, the area defined by half the distance from a passing grid point to each of the adjacent grid points is considered a passing area.

Once the pass region has been determined, the predicted probability of manufacturing a cell whose operation is not affected by device variations (e.g., a good memory cell) may be calculated. An integration of probability over the area of a square of interest (e.g., each square within the pass region) is performed to get a probability for that square. For each axis, the complementary error function (the "erfc") is determined for X sigma to infinity. The calculation is performed twice: for X1 to infinity and for X2 to infinity. The difference between the integration over the two ranges represents the probability from X1 to X2. The calculated probabilities for each square within the pass region are then summed to determine the overall probability.

The complementary error function is described at Math-World—A Wolfram Web Resource by Eric W. Weisstein, "Erfc" http://mathworld.wolfram.com/Erfc.html which is hereby incorporated herein for all purposes. The above described calculations using the erfc function may be implemented in software. The following C code represents an embodiment of a method for computing the predicted probability of manufacturing a cell whose operation is not affected by device variations using the erfc function.

```
#include <stdio.h>
#include <stdlib.h>
#include <math.h>
double from_norm (double x,double sigma, double mean);
double prob_of_range (double x1,double x2, double sigma,
double mean );
double prob_to_sigma_calc (double prob);
double pi =
3.14159265359,x1,x2,z,sigma,mean,x1_temp,res=10000,deltax,
zsum=0,p1,p2;
double prob_of_range (double x1,double x2, double sigma,
double mean )
{
  /*printf("Prob_of_Range %g %g %g %g\n",
x1,x2,sigma,mean);*/
    */ correct te order for decreasing values */
    if (x1 > x2) {
      x1_temp = x2;
      x2 = x1;
      x1 = x1_temp;
    }
    p1 = (0.5 * erfc(((x1-mean)/sigma)/sqrt(2)));
    p2 = (0.5 * erfc(((x2-mean)/sigma)/sqrt(2)));
    zsum = p1 - p2;
    /*printf("zsum=%g\n",zsum);*/
    return zsum;
}
double from_norm (double x,double sigma, double mean) {
    return ((1/(sqrt(2*pi)*sigma)) * exp((-1*pow((x -
```

-continued

```
mean),2))/(2*pow(sigma,2))));
}
double prob_to_sigma_calc (double prob) {
    double sigma =-10, delta = 1, mindelta = .001, temp;
    /* Keep incrementing sigma until returned prob is
smaller, reset starting point reduce delta and repeat
until mindelta is reached. */
    while (delta > mindelta) {
        temp = prob_of_range(sigma,10, 1, 0);
        /*printf("%.20f %.20f %.20f\n",temp, sigma,
delta)*/;
        if (temp < prob) {
           sigma = sigma - delta;
           delta = delta/2;
        } else {
           sigma = sigma + delta;
        }
    }
    return sigma;
}
```

The overall probability may next be used to calculate the predicted yield percentage that may be expected from a memory array comprised of a large number of memory cells (without regard to failures from process defects). In Step 314, a predicted yield percentage of a memory array comprised of a plurality of the simulated memory cells is calculated based on the predicted probability the simulated memory cell will operate correctly. For an array without redundancy, the calculation is as follows:

$$\text{Prob(good array)}=P^B$$

where P represents the probability of manufacturing a good cell and B represents the number of bits (memory cells) in the memory array. This calculation assumes that the chance of a bit being good (e.g., operational) is independent of the chance of any other bit in the memory array being good.

In Step 316, the predicted yield percentage may be used to determine the amount of redundancy that a memory array is likely to need in order to have an actual yield percentage that is acceptably high (e.g., 99%). As indicated above, by adding extra or redundant cells to a memory design, the total actual yield for a design may be improved if such redundant cells are used as "repair cells" in place of cells that have failed. Such repair cells may be included in a memory design in the form of one or more repair elements which each may include a column (or row) of memory cells associated with the memory array to be repaired. If, for example, during testing of a memory array, a failure is detected in a given column of memory cells, a manufacturing process may be invoked wherein the column including the failed cell is electrically disconnected from the memory array and steer logic is configured to enable a repair element to be automatically accessed whenever an access of the disconnected column is attempted.

To state the above differently, the present invention allows a memory designer to calculate, via simulation, the appropriate number of repair elements to include in a memory design to compensate for failures caused by device variations, using the predicted yield percentage and without first having to build and test a physical memory. As described above, using the predicted yield percentage, the number of expected failures can be determined for the array. In some embodiments, for each expected failure, an additional repair element may be included in the design.

In other embodiments, the probability of a failure occurring in the repair elements and the possibility that more than one failure may occur in the same column may also be considered. Thus, via an extended calculation, a determination of whether to include more or less repair elements than the predicted number of cell failures in the main memory array, may be made. This calculation also allows a memory designer to determine if a memory design with redundancy (e.g., that already includes repair elements) will have a desired yield once the repair elements are activated if necessary.

For purposes of understanding the following calculation, a memory array that includes redundancy may be thought of simply as a large set of repair elements. Thus, a memory array with redundancy will be functional (e.g., have 100% of the nominal number of bits operational) if a sufficient number of the "repair elements" are good (e.g., only include correctly operating cells) such that the memory array has its nominal amount of storage capacity. For example, assume that a memory array with redundancy has a nominal size of one megabyte and includes N columns of R bits (memory cells), that a repair element is a one dimensional array of R bits, and that the memory array has one such repair element in addition to the N columns. Thus, the entire structure includes N+1 columns and the memory array can be made to be functional if at least N of the N+1 columns are good such that at least one megabyte of memory cells are operational. The probability of a single column being good is:

$$\text{Prob(good column)} = P^B$$

where P represents the probability of manufacturing a good cell and R represents the number of bits (memory cells) in a column.

As indicated above, the probability of being able to manufacture a functional (e.g., has 100% of the nominal number of bits operational) memory using redundancy (as needed) is equal to the probability of the array having at least N good columns among the N+1 columns. The probability of the array having at least N good columns can be expressed as:

$$\begin{aligned}\text{Prob(at least } N \text{ good columns among } N+1 \text{ total columns)} &= \text{Prob}(N+1 \text{ good columns}) + \text{Prob}(N \text{ good columns}) \\ &= \{P^{[R(N+1)]}\} + \{[N+1] * \\ &= \lfloor 1 - P^R \rfloor * \lfloor P^{(RN)} \rfloor ]\}\end{aligned}$$

This expression can be generalized to represent the probability of a memory array having at least N good columns among a total of N+K columns, where K represents the number of repair elements. The equation may be expressed as:

$$\begin{aligned}\text{Prob(at least } N \text{ good columns among } N+K \text{ total columns)} &= \sum_{j=0}^{K}\binom{N+K}{j}(1-P^R)^j(P^R)^{N+K-j} \\ &= \{P^{[R(N+K)]}\} + \\ &\quad \{(N+K)(1-P^R)P^{[R(N+K)]}\} + \ldots + \\ &\quad \left\{\left[\frac{(N+K)!}{N!K!}\right]\left[(1-P^R)^K\right]\left[P^{(RN)}\right]\right\}\end{aligned}$$

where P represents the probability of manufacturing a functional memory cell, N represents the number of columns in a memory array not including any redundancy, K represents the number of repair elements associated with the memory array (each repair element being the same size as a single memory array column), and R represents the number of bits (memory cells) in a column of the memory array (or one of the repair elements). Note that "N+K over j" in this equation represents "N+K choose j" and denotes the number of j-element subsets that one can form from an (N+K)-element set.

Using the above equation, the probability of achieving a desired yield for a memory array with redundancy may be determined. A memory designer may use this equation to optimize the amount of redundancy for a desired yield by finding the smallest value of K (the number of repair elements) in which the equation provides a probability value closest to the desired yield (e.g., an acceptable level). The equation may also be used to optimize memory designs that have redundant rows by substituting row information for column information in the above equation. Thus, different types of redundancy designs may be compared as well as different amounts of redundancy. The method 300 ends at Step 318.

In some embodiments, any inaccuracies in the above described simulation models may be adjusted by comparing the predicted yield to the actual yield measured by testing manufactured memory arrays. Simulation model inaccuracies may result from different sources. For example, memory device switching history effects may be difficult to simulate. In silicon-on-insulator (SOI) solid-state technology, a transistor's threshold voltage is a function of the base threshold voltage. Base threshold voltage is determined by the number of dopant atoms in the device along with the switching history of the device. The switching history of the device reflects the coupling of charge into and out of a floating body node of the device during device operation. The voltage of the floating body node directly adjusts the threshold voltage of the device. While this aspect of SOI devices has a performance benefit, this aspect also may cause device matching within a memory cell to be difficult and accurate characterization of the floating body node in an SOI device for a simulation model may be problematic. However, by determining the number of failures that resulted from device variations (e.g., via hardware tests for voltage dependent failures) in a manufactured memory array of a known size, the actual probability of manufacturing a good memory cell may be calculated. The actual probability may be compared to the predicted probability and any differences may be used to modify the simulation models.

In some embodiments, as mentioned above, failures attributed to process defects may be separately predicted based on collected information about, for example, single cell fails, cell pair fails, wordline fails, bitline fails, etc. These predicted fails may be used to determine the predicted probability of a good cell and different redundancy designs may be analyzed using the above equations. Further, the predicted probability of a single cell experiencing a failure due to process defects may be compared to the observed actual failure rate attributed to process defects and any differences noted may be used to improve the original failure predictions.

As described herein, the apparatus and methods of the present invention can be utilized to predict memory yields due to process defects and device variations and/or to calibrate redundancy to achieve acceptable yields. The apparatus and methods of the present invention can be utilized to perform iterative processes which can be designed to predict memory yields, calibrate redundancy, and to generate enhanced fabrication models designed to provide for optimum product yield in memory chip or device fabrication processes, in a continuous and on-going manner.

The foregoing description discloses only exemplary embodiments of the invention. Modifications of the above disclosed apparatus and method which fall within the scope of The invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A method comprising:
   determining a model of a memory cell;
   identifying a subset of parameters of the memory cell that influence a stability performance of the memory cell;
   determining a refined model of the memory cell based on the identified subset of parameters;
   simulating operation of variations of the refined model using different combinations of values of the parameters;
   determining a predicted probability that the simulated memory cell will operate correctly based on the simulated operation;
   calculating a predicted yield percentage of a memory array comprised of a plurality of the simulated memory cells based on the predicted probability the simulated memory cell will operate correctly; and
   determining a minimum number of repair elements that would change the predicted yield percentage of the memory array with redundancy to an acceptable level.

2. The method of claim 1 wherein determining a model includes determining a first characterization of a memory cell device, wherein the first characterization is based on a plurality of parameters each having a distribution about a nominal value.

3. The method of claim 2 wherein identifying a subset of parameters includes identifying a subset of the parameters that influence a stability performance of a memory cell that is modeled using a simulated circuit that includes a plurality of the first characterized memory cell devices, wherein the subset of the parameters are identified based on the parameters influencing the stability performance more than remaining parameters influence the stability performance in a simulation.

4. The method of claim 3 wherein determining a refined model includes determining a second characterization of the memory cell device, wherein the second characterization is based on the identified subset of parameters.

5. The method of claim 4 wherein simulating operation includes simulating operation of variations of the memory cell modeled using a simulated circuit that includes a plurality of the second characterized memory cell devices, wherein simulating is performed for each different combination of values of the parameters, varied over a predefined range of the parameters' distributions, of each of the identified subset of parameters of each of the second characterized memory cell devices.

6. The method of claim 1 further comprising determining an observed probability that a memory cell operates correctly based on testing a manufactured memory array of the memory cells for voltage dependent failures.

7. The method of claim 6 further comprising refining the refined model of the memory cell based on any difference between the predicted probability and the observed probability.

8. The method of claim 1 further comprising determining an observed probability that a memory cell operates correctly based on testing a manufactured memory array of the memory cells for failures due to device defects.

9. The method of claim 8 further comprising refining the refined model of the memory cell based on any difference between the predicted probability and the observed probability.

10. A method comprising:
    determining a first model of a memory cell device, wherein the first model is based on a plurality of parameters each having a distribution about a nominal value;
    identifying a subset of the parameters that influence a stability performance of a memory cell that is modeled using a simulated circuit that includes a plurality of the first modeled memory cell devices, wherein the subset of the parameters are identified based on the parameters influencing the stability performance more than remaining parameters influence the stability performance in a simulation;
    determining a second model of the memory cell device, wherein the second model is based on the identified subset of parameters;
    simulating operation of variations of the memory cell modeled using a simulated circuit that includes a plurality of the second modeled memory cell devices, wherein simulating is performed for each different combination of values of the parameters, varied over a predefined range of the parameters' distributions, of each of the identified subset of parameters of each of the second modeled memory cell devices;
    determining a predicted probability the simulated memory cell will operate correctly based on the simulated operation of the memory cell variations;
    calculating a predicted yield percentage of a memory array comprised of a plurality of the simulated memory cells based on the predicted probability the simulated memory cell will operate correctly; and
    determining a number of repair elements that would change the predicted yield percentage of the memory array with redundancy to an acceptable level.

11. The method of claim 10 further comprising:
    determining an observed probability that a memory cell operates correctly based on testing a manufactured memory array of the memory cells for voltage dependent failures; and
    refining the second model of the memory cell device based on any difference between the predicted probability and the observed probability.

12. An apparatus comprising:
    a storage device; and
    a processor coupled to the storage device adapted to:
        determine a model of a memory cell,
        identify a subset of parameters of the memory cell that influence a stability performance of the memory cell,
        determine a refined model of the memory cell based on the identified subset of parameters,
        simulate operation of variations of the refined model using different combinations of values of the parameters,
        determine a predicted probability that the simulated memory cell will operate correctly based on the simulated operation,
        calculate a predicted yield percentage of a memory array comprised of a plurality of the simulated memory cells based on the predicted probability the simulated memory cell will operate correctly, and
        determine a minimum number of repair elements that would change the predicted yield percentage of the memory array with redundancy to an acceptable level.

13. The apparatus of claim 12 wherein the processor adapted to determine a model includes the processor being adapted to determine a first characterization of a memory cell device, wherein the first characterization is based on a plurality of parameters each having a distribution about a nominal value.

14. The apparatus of claim 13 wherein the processor adapted to identify a subset of parameters includes the processor being adapted to identify a subset of the parameters that influence a stability performance of a memory cell that is modeled using a simulated circuit that includes a plurality of the first characterized memory cell devices, wherein the subset of the parameters are identified based on the parameters influencing the stability performance more than remaining parameters influence the stability performance in a simulation.

15. The apparatus of claim 14 wherein the processor adapted to determine a refined model includes the processor being adapted to determine a second characterization of the memory cell device, wherein the second characterization is based on the identified subset of parameters.

16. The apparatus of claim 15 wherein the processor adapted to simulate operation includes the processor being adapted to simulate operation of variations of the memory cell modeled using a simulated circuit that includes a plurality of the second characterized memory cell devices, wherein simulating is performed for each different combination of values of the parameters, varied over a predefined range of the parameters' distributions, of each of the identified subset of parameters of each of the second characterized memory cell devices.

17. The apparatus of claim 12 wherein the processor is further adapted to determine an observed probability that a memory cell operates correctly based on data received from testing a manufactured memory array of the memory cells for voltage dependent failures.

18. The apparatus of claim 17 wherein the processor is further adapted to refine the refined model of the memory cell based on any difference between the predicted probability and the observed probability.

19. The apparatus of claim 12 wherein the processor is further adapted to determine an observed probability that a memory cell operates correctly based on data received from testing a manufactured memory array of the memory cells for failures due to device defects.

20. The apparatus of claim 19 wherein the processor is further adapted to refine the refined model of the memory cell based on any difference between the predicted probability and the observed probability.

* * * * *